United States Patent [19]

Beltz

[11] Patent Number: 5,247,134
[45] Date of Patent: Sep. 21, 1993

[54] HEAT-RESISTANT HERMETIC PACKAGES FOR ELECTRONIC COMPONENTS

[75] Inventor: Kenneth A. Beltz, Stewartsville, N.J.

[73] Assignee: Frenchtown Ceramics, Co., Frenchtown, N.J.

[21] Appl. No.: 748,027

[22] Filed: Aug. 21, 1991

Related U.S. Application Data

[62] Division of Ser. No. 612,514, Nov. 13, 1990, Pat. No. 5,093,989.

[51] Int. Cl.$^5$ ............................................. H01L 23/02
[52] U.S. Cl. ..................................... 174/52.4; 257/690
[58] Field of Search .................... 174/52.1, 52.2, 52.3, 174/52.4; 257/678, 690, 692, 693, 694

[56] References Cited

U.S. PATENT DOCUMENTS

| | | | |
|---|---|---|---|
| 4,504,887 | 3/1985 | Bakermans et al. | 361/399 |
| 4,506,108 | 3/1985 | Kersch et al. | 174/52.4 |
| 4,547,624 | 10/1985 | Tower et al. | 174/52.4 |

Primary Examiner—Leo P. Picard
Assistant Examiner—Bot L. Ledynh
Attorney, Agent, or Firm—Cesari and McKenna

[57] ABSTRACT

A heat-resistant package for electrical components comprises a housing composed of a plurality of independent side walls made of heat resistant ceramic material. Sealed-in leads are provided in one or more of the side walls. After, the leads are installed the ends of the side walls are brazed together to form a closed ring and that ring is brazed to the housing bottom wall. Also, a continuous metal ring may be brazed to the tops of the side walls. The brazings provide hermetic seals between the housing walls and they, along with the seal ring, provide compliance between the walls making the housing resistant to thermal shocks.

7 Claims, 2 Drawing Sheets

HEAT-RESISTANT HERMETIC PACKAGES FOR ELECTRONIC COMPONENTS

RELATED APPLICATION

This application is a division of Ser. No. 612,514, filed Nov. 13, 1990, now U.S. Pat. No. 5,093,989.

This invention relates to the packaging of electronic components. It relates more particularly to a so-called power package capable of withstanding very high temperatures caused by a heat source inside the package or a hostile external environment. It relates also to the method of making such a package.

BACKGROUND OF THE INVENTION

An electronic package is basically an open-top housing for containing one or more circuit components such as a diode, transistor, integrated circuit, etc., and a cover for the housing. A so-called power package is one which is hermetically sealed and able to withstand very high temperatures. In order to provide electrical links between those components and the outside world, electrical feed-throughs or leads are provided in one or more walls of the package housing. The leads have to be hermetically sealed in those walls in order to maintain the integrity of the package. In practice, if there is a failure of the package, i.e. a leak, it usually occurs at one or another of its sealed-in leads. Such failures can be due to external effects such as corrosion at the lead due to the environment, or they may be due to differences in the thermal and/or electrical characteristics of the materials comprising the package itself.

Conventionally, the power package housing is composed of side walls formed integrally as a ring and a flat bottom wall or base which is brazed to the lower edges of the side walls. The side walls may be made of a heat-resistant metal, e.g. molybdenum, tungsten, copper, copper alloy, nickel, iron or its alloys, or a ceramic such as alumina or beryllia. Since the bottom wall or base of the package is usually subjected to the most heat, that wall, although it may also be of metal, is often a flat wafer or plate made of a ceramic material such as alumina or beryllia that is brazed to the lower edges of the side walls. Usually metallic features are printed on the base, or conductive mounting pads are provided there, for mounting the circuit components to be housed in the package. The features and pads may also provide electrical connections for the components, (e.g. a ground plane).

If the package is constructed of two pieces, i.e. a ring-like side wall and flat base, prior to brazing the base to the side walls, leads are installed in one or more of the side walls. For this, the side walls are formed with through-holes for receiving the leads. A glass or ceramic seal is provided in the space between the leads and the walls of the holes to mechanically fix the leads and to hermetically seal them to the housing walls. If the package is of one-piece construction, the procedure is the same as above without the need to braze the side wall to the base.

One drawback of prior power packages of this general type is that they have a relatively high rejection rate when installing components in the packages so that their overall manufacturing cost is excessively high. Usually, the rejection occurs because of a failure in the hermetic seal at one or another of the leads. Another frequent failure is glass cracking in the meniscus around the lead which exposes base metal and results in subsequent corrosion problems. The failure rate is usually higher for glass-sealed leads than for ceramic-sealed ones. But for both, the failure of a single such seal means a rejection of the entire housing, or at least the side walls thereof since they are invariably formed integrally as a ring.

Also, prior power packages are relatively heavy either because their housings are made of metal or the integrally formed walls have to be relatively thick in order for the housings to be able to withstand the requisite temperature extremes. While the weight of such a small object may appear, at first glance not to be of not much consequence, in some aerospace applications, many power packages must be used in a single satellite, missile or the like, so that minimizing the weight of each package becomes important.

SUMMARY OF THE INVENTION

Accordingly, the present invention aims to provide a reliable hermetic package for housing electrical components in a high temperature environment.

Another object of the invention is to provide power package which has minimum weight.

A further object of the invention is to provide a power package which suffers a lower rejection rate in subsequent operations than prior comparable packages of this general type.

Still another object of the invention is to provide a package of this type which can withstand extreme temperature fluctuations without failure.

Yet another object of the invention is to provide such a package which has a relatively low unit cost as compared with total production processing costs of prior comparable packages.

Yet another object of the invention is to provide a power package whose parts can be incorporated into different size packages.

Another object of the invention is to provide a method of making a power package having one or more of the above advantages.

Other objects will, in part, be obvious and will, in part, appear hereinafter.

The invention accordingly comprises the several steps and the relation of one or more of such steps with respect to each of the others and the product possessing the features, properties and relation of elements which are exemplified in the following detailed description, and the scope of the invention will be indicated in the claims.

Briefly, my power package, as do most others, comprises a housing and a cover. Unlike prior packages, however, all of the walls of the housing are formed as separate metallized ceramic parts which are assembled and brazed together. If a particular package requires leads in one or another of its side walls, the leads are brazed-in prior to assembly of the housing. Therefore, the effectiveness of the seals at the leads can be tested prior to assembly of the walls. If there is a seal failure, that failure results in rejection of only that particular side wall. Another advantage of forming the package housing walls separately is flexibility. That is, the same side walls can be used to make packages of different lengths or widths. Both of these features result in considerable cost savings.

The package housing is assembled by arranging the housing side walls in a ring and brazing them to each other and to an appropriately dimensioned bottom wall or base. Preferably also, an integrally formed metallic seal ring is brazed to the tops of the side walls. The brazings between the walls and the seal ring strengthen the housing and provide stress relief. Resultantly, the package housing is extremely resistant to thermal shock. Even so, my package is lighter in weight than conventional metal packages and some ceramic packages and it is no more expensive to make than conventional packages having integrally-formed side walls.

After the housing has been made and tested, electrical components may be mounted to the housing base and connected electrically to the housing leads. Then, the cover may be sealed to the tops of the housing walls to complete the package.

BRIEF DESCRIPTION OF THE DRAWINGS

For a fuller understanding of the nature and objects of the invention, reference should be had to the following detailed description taken in connection with the accompanying drawings, in which.

DESCRIPTION OF THE PREFERRED EMBODIMENT

Figure 1:
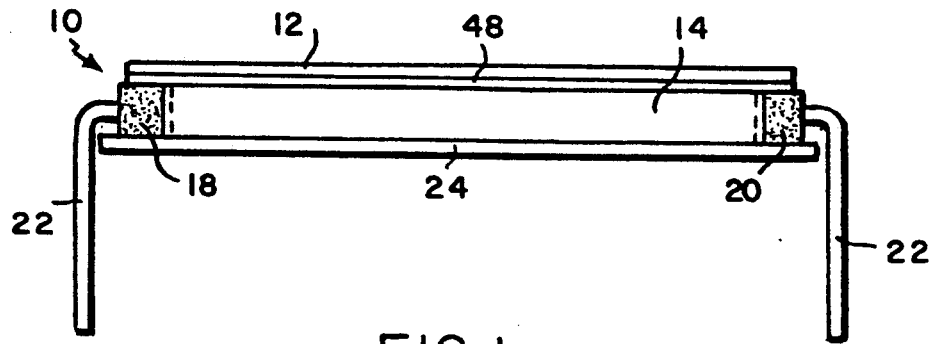
FIG. 1 is a side elevational view of a heat-resistant power package incorporating my invention.
Figure 4:
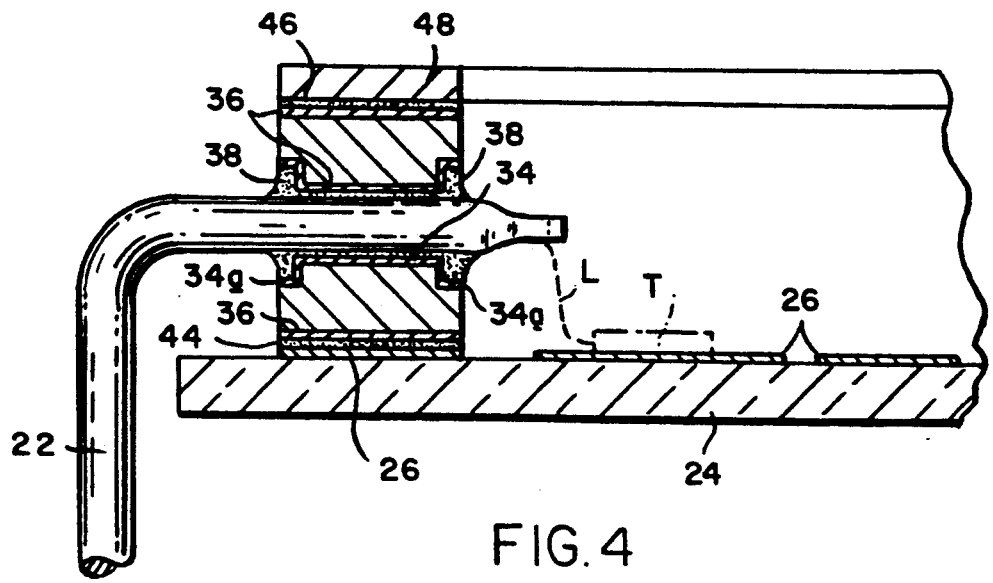
FIG. 4 is an enlarged sectional view taken along line 4—4 of FIG. 2.

Referring to FIG. 1 of the drawings, the illustrated package comprises an open-top housing shown generally at 10 which is designed to contain on or more electrical components, e.g. transistor, diode, integrated circuit, etc., one of which is shown in phantom at T in FIG. 4. After the components are mounted inside housing 10, the opening at the top of the housing is closed by a plate-like cover 12 made of a suitable metal and welded, soldered or otherwise sealed to the top of housing 10.

Figure 2:
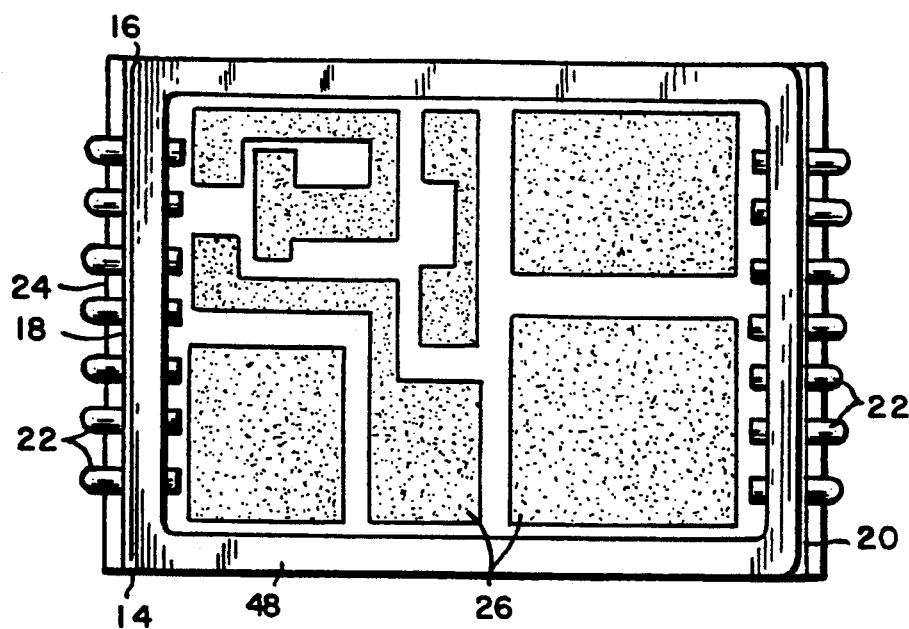
FIG. 2 is a plan view, with the cover removed, of the FIG. 1 package.
Figure 3:
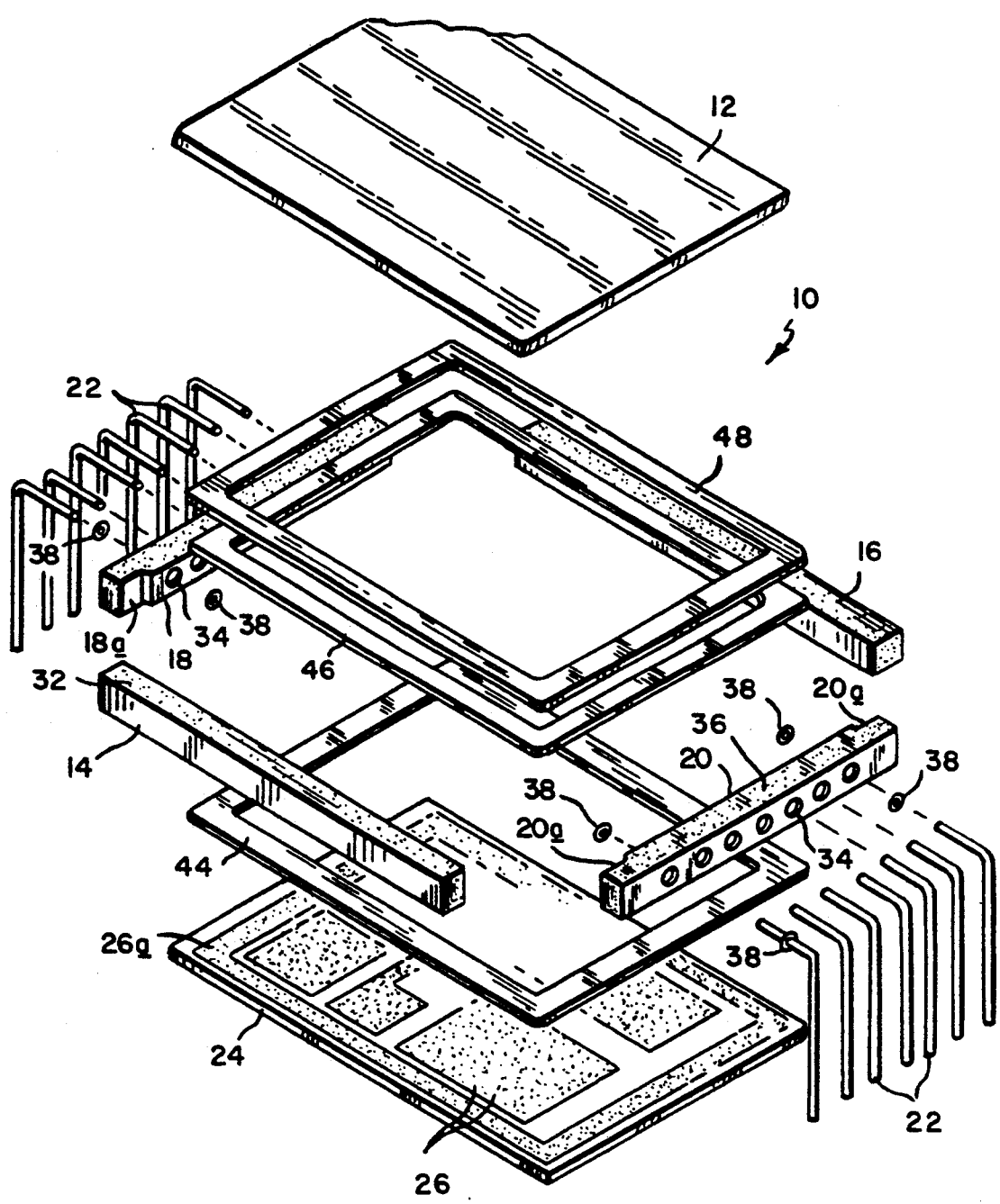
FIG. 3 is an exploded isometric view showing the components of the FIG. 1 package in greater detail.

As shown in FIGS. 1 to 3, housing 10 has four separate side walls 14, 16, 18 and 20 formed in a manner to be described later. Two of these side walls 18, 20, which may be mirror images of one another, are provided with electrical feed-throughs or leads 22. The other two side walls 14, 16, which may also be mirror images of one another, have no leads. It should be understood, however, that in any particular package, the number and arrangement of leads 22 may vary and all four sides could be more or less the same. That is, leads may extend through any one or more of the side walls, with their placements depending upon the locations of the components T inside the housing 10 and the layout of the external circuitry to which the package will be connected.

Housing 10 also includes a plate-like bottom wall or base 24 which is usually also made of a ceramic material such as alumina or beryllia, although it may also be of a metal such as, molybdenum, a tungsten-copper alloy, copper or copper alloys, iron-nickel or its alloys or other compatable materials. Usually a layer 26 of metal, such as nickel, is plated on the upper surface of base 24 to define conductive features (shown by stippling in FIGS. 2 and 3) to which the components inside the package can be mounted as shown in phantom in FIG. 4. That layer may, in some cases, be coated with gold to minimize oxidation of those metal areas. These features may also constitute electrical connections to those components T and may be connected to one or another of the leads 22. To optimize the bond between the plated layer 26 and base 24, a thin coating (not shown) of a refractory metal such as molybdenum or tungsten may be applied to the base before plating to enhance the bond strength. Other known ceramic metallizing techniques such as, vapor deposition, direct bonded copper, or titanium hydride processing could also produce suitable packages. Preferably also, layer 26 includes a border area 26a (FIG. 3) which is used to secure the side walls 14–20 to the base as will be described presently.

Instead of printing metal features on base 24 for mounting the components T, in some cases, mounting pads may be employed which may be brazed or attached by other means, e.g. soldering, epoxy resin, etc., directly to the base if the base is of an insulating material or by way of an insulating pad if the base is of metal.

Referring now to FIG. 3, in the manufacture of the package, after the housing side walls 14 and 16 are pressed and fired, a thin layer 32 of a metal such as nickel and/or gold may be plated over all six surfaces of each side wall 14,16 as indicated by the stippling in FIG. 3. As with base 24, there may also be an undercoating of molybdenum or tungsten or another known metallizing system. Then, the coating 32 is removed, e.g. by grinding or etching, from the inner and outer faces of each wall 14,16.

The other housing side walls 18, 20 are formed in more or less the same way. However, although not necessarily, the inner faces at the opposite ends of those side walls may be provided with notches 18a,20a, respectively, to provide seats for the end faces of side walls 14,16 when the housing is assembled. Also, a series of through-holes 34 is provided in each side wall 18,20 to receive the leads 22. Preferably, each hole 34 is countersunk at both ends as shown at 34a in FIG. 4 to ensure a reliable hermetic seal. However, seals could be produced without those countersinks. Then, all surfaces of the side walls 18,20 are plated with metal layers 36 similar to the layers 32 on side walls 14,16, the layers 36 also covering the walls of the countersunk holes 34. Layers 36 are then removed from the inner and outer faces of the side walls 18,20, thereby electrically isolating the plated holes 34.

Still referring to FIG. 3, before the side walls 14–20 are assembled to base 24, the leads 22 are installed in the two side walls 18 and 20. The leads may be straight or bent down as shown to facilitate mounting the package to a PC board or other circuit. When inserting a lead 22 into its hole 34, a small silver (VTG) or other braze alloy ring 38 is slid onto the end of the lead. After the lead is inserted into its hole, it may be desirable to place another similar ring onto the projecting end of the lead so that both rings seat in the countersunk 34a areas to be brazed of that hole. After all of the leads are inserted and, by way of appropriate fixtures (not shown), centered in their respective holes, each side wall 18,20 is heated in a furnace with the appropriate atmosphere (nonoxidizing or vacuum) to a temperature sufficient to melt the rings 38 (e.g. 960° C. if the braze is silver) so that the metal thereof penetrates into the space between each lead 22 and the plated wall of the corresponding hole 34. Also, metal menisci form between the lead and the ceramic wall as shown in FIG. 4. Resultantly, when the side walls 18,20 are cooled, tough, tightly bonded, ductile hermetic seals are formed between the leads 22 and the housing section side walls 18,20.

After the side walls 18,20 have been completed as aforesaid, they can be tested for seal failures around the leads. It is important to appreciate that if there is a defect at one or another of the leads 22, only the particular side wall is affected since it has not yet been assembled to the other side walls and to bottom wall 24. This results in a considerable savings in manufacturing costs since waste is minimized and, on the assembly line, the defective part ca be replaced immediately with one that has already passed the test.

As noted previously, the ceramic base 24 is plated to provide not only the features for mounting the components to be contained in the housing section 10, but also the border area 26a for mounting the side walls 14–20. During the assembly process, a flat generally rectangular ring 44 made of silver (VTG) or other braze alloy is placed on that area 26a and the housing section side walls are brought together to form a ring and seated on top of ring 44. Another similar braze ring 46 is seated on the upper surfaces of those side walls. Finally, a flat, thin (e.g. 0.020 in.), generally rectangular metal seal ring 48 is superimposed on ring 46.

To maximize the resistance of housing 10 to thermal shocks, it is important that the materials comprising the housing walls, including the plated layers 32,36 thereon, the leads 22 and seal ring 48 be made of materials having the same or similar coefficients of thermal expansion. For example, if the walls 18,20 are of alumina (94%) metallized and plated over with nickel and/or gold, the leads 22 and seal ring 48 may be of nickel alloy, stainless steel or other compatable metal.

After all of the housing 10 walls have been assembled as shown in FIGS. 2 and 4, the entire assembly is heated in a furnace with the appropriate atmosphere to a temperature sufficient to melt the braze rings 44 and 46 (e.g. 960° C.). Some of the ring metal wicks into the spaces between the opposing ends of the sidewalls and brazes those ends together. This brazing step does not necessarily remelt the brazed seals at the leads 22 because when those leads are brazed in, some of the nickel in the plated layer 36 usually becomes alloyed with the silver or other braze alloy thereby raising the melting point of those seals above the braze melting point. After the assembly has cooled, the side walls 14–20 have become brazed to bottom wall 24 and to each other. Also, the ring 48 is brazed to the tops of the side walls forming a continuous metal band extending around the top of the housing 10. In the completed housing section 10, the ring 48 provides strength at the top of the housing and a seating surface for the cover 12.

Housing 10, formed as aforesaid, is found to be extremely rugged and resistant to rapid changes in temperature. The end brazings connecting the side walls, coupled with the brazed-on continuous metallic seal ring 48, provide stress relief particularly at the corners of housing 10, making the otherwise very rigid housing compliant enough to withstand extremely severe thermal shocks. In actual tests, housings 10 made in accordance with this invention have been heated to temperatures in excess of 400° C. and then immediately immersed in liquid nitrogen (−210° C.) without suffering stress fracture or seal failure. Such temperatures are far more extreme then those likely to be encountered during the normal useful lives of the packages.

Once the housing 10 has been completed and examined for defects or tested, the components T may be installed in the housing by mounting the components to the features defined by layer 26 on base 24. Appropriate electrical wires, one being shown in phantom at L in FIG. 4, are provided between the various terminals of component T and the leads 22. After the usual electrical tests have been performed, the cover 12 may be welded, soldered or otherwise secured to the seal ring 48 thereby hermetically sealing the components T within the package.

It will be seen from the foregoing that the described power package composed of separately formed walls which are brazed together and topped off with a continuous metal seal ring provides several advantages not found in prior comparable packages of this general type. The walls can be tested separately for defects prior to assembly. If a defect is found, only the offending part is wasted. Also, the separately formed walls can be used to make packages having different dimensions. For example, the same walls 18 and 20 can be used in conjunction with longer or shorter walls 14, 16 and 24 to make longer or shorter packages. Finally, when assembled as described, the package forms a hermetically sealed container for electrical components which is extremely resistant to the thermal shocks that might be encountered during the normal life of the package.

It will thus be seen that the objects set forth above, among those made apparent from the preceding description, are efficiently attained. Also, certain changes may be made in the carrying out of the above process and in the construction set forth without departing from the scope of the invention. For example, various known ceramics other than alumina and beryllia may be used to form the package and those ceramic parts may be metallized and brazed using different known metals and techniques. Also, in some less stressful applications, the leads or feed-throughs may be sealed in the side walls by glass or ceramic eyelets. Therefore, it is intended that all matter contained in the above description or shown in the accompanying drawings be interpreted as illustrative and not in a limiting sense.

It is also to be understood that the following claims are intended to cover all of the generic features of the invention herein described.

I claim:

1. A heat-resistant package for electrical components comprising a housing composed of
  a plurality of independent side walls made of heat resistant ceramic material, each side wall having opposite ends, top and bottom faces, opposite side faces, and end faces,
  one or more electrical leads extending through at least one of said side walls and projecting from the opposite side faces thereof,
  means defining a hermetic seal between each of said leads and its associated side wall,
  metal brazings connecting the opposite ends of said side walls to form a closed ring, said brazings forming hermetic seals between said side walls,
  a bottom wall made of a heat-resistant material,
  brazing means connecting the bottom wall to the bottom faces of said side walls, said brazing means forming hermetic seals between said side and bottom walls, said brazings and brazing means also providing compliance between said side and bottom walls rendering the housing resistant to thermal shocks.

2. The package defined in claim 1 and further including
   a metal seal ring dimensioned to seat on the top faces of said side walls, and
   means for brazing said seal ring to the top faces of said side walls.

3. The package defined in claim 2 and further including
   a cover sized to seat on said seal ring, and
   means for securing said cover to said seal ring.

4. The package defined in claim 1 and further including
   means defining a notch adjacent to the end of one or more said side walls at the side face thereof facing the opposite side wall for interfitting with and seating the adjacent end face of the side wall to which it is connected.

5. The package defined in claim 1 and further including
   metal plating on the faces of said housing walls which are brazed together.

6. The package defined in claim 5 and further including
   additional metal plating on the top faces of said side walls;
   a metal seal ring sized to seat on the top faces of said side walls, and
   means for brazing said seal ring to the plated top faces of said side walls.

7. The package defined in claim 1 wherein
   each of said side walls has a through-hole for receiving each lead extending therethrough;
   a metal plating is present on the wall of each through-hole, and
   said seal defining means include a metal brazing between said lead and said plated hole wall.

* * * * *